(12) United States Patent
Pedretti et al.

(10) Patent No.: US 6,651,324 B1
(45) Date of Patent: Nov. 25, 2003

(54) PROCESS FOR MANUFACTURE OF PRINTED CIRCUIT BOARDS WITH THICK COPPER POWER CIRCUITRY AND THIN COPPER SIGNAL CIRCUITRY ON THE SAME LAYER

(75) Inventors: Giuseppe Pedretti, Cremona (IT); Ken Varley, County Durham (GB)

(73) Assignee: Viasystems Group, Inc., St. Louis, MO (US)

( * ) Notice: Subject to any disclaimer, the term of this patent is extended or adjusted under 35 U.S.C. 154(b) by 28 days.

(21) Appl. No.: 09/707,033

(22) Filed: Nov. 6, 2000

(51) Int. Cl.$^7$ .............. H05K 3/02; H05K 3/36; H05K 3/06; B05D 5/12
(52) U.S. Cl. .............. 29/846; 29/830; 29/831; 29/842; 29/847; 427/96
(58) Field of Search .............. 29/825, 829, 830, 29/831, 842, 846, 847; 228/180.21, 180.22, 175, 103.1, 298; 427/96

(56) References Cited

U.S. PATENT DOCUMENTS

| | | | |
|---|---|---|---|
| 2,958,120 A | * 11/1960 | Taylor | 156/298 |
| 3,646,572 A | 2/1972 | Burr | |
| 3,934,335 A | * 1/1976 | Nelson | 174/266 |
| 4,401,521 A | * 8/1983 | Ohmura et al. | 156/150 |
| 4,606,787 A | * 8/1986 | Pelligrino | 156/150 |
| 4,889,584 A | * 12/1989 | Wada et al. | 156/151 |
| 5,073,456 A | 12/1991 | Palladino | |
| 5,789,142 A | * 8/1998 | Brown | 430/315 |
| 5,926,377 A | 7/1999 | Nakao et al. | |
| 5,928,790 A | 7/1999 | Bokisa | |
| 5,930,112 A | 7/1999 | Babinski et al. | |
| 6,042,685 A | 3/2000 | Shinada et al. | |
| 6,233,821 B1 | * 5/2001 | Takahashi et al. | 29/847 |

FOREIGN PATENT DOCUMENTS

JP 06053631 A * 2/1994 .............. H05K/3/06

* cited by examiner

Primary Examiner—Allan N. Shoap
Assistant Examiner—Isaac Hamilton
(74) Attorney, Agent, or Firm—Dunlap Codding & Rogers

(57) ABSTRACT

A process of manufacturing printed circuit boards which is useful in the formation of printed circuit boards containing both areas of thick conductive traces and areas of fine resolution conductors in a single conductive layer, and printed circuit boards formed from such a process. A conductive core is first fabricated containing areas of thick conductors on a relatively thin conductive base. The conductive core is then bonded to a sublayer such as "prepreg" with the thick conductive areas adjacent to the sublayer in order to form a relatively flat laminate. Proper bonding typically requires the use of high resin "prepreg" sublayer. In the alternative, an additional inner layer of pure resin cab be inserted between the conductive core and the insulating sublayer prior to bonding. After bonding, the conductive surface of the laminate is formed into printed conductor traces by methods known in the art. For example, chemical etching may be used to remove conductive material not comprising the printed circuits. In various embodiments of the invention a solder mask coating is applied to the completed printed circuit board. By use of this process, a single layer printed circuit comprising both thick conductor traces and fine resolution traces is possible. This invention is also useful in manufacturing a printed circuit core or layer suitable for use as a component in a multilayer printed circuit board where it is desirable that a relative flat layer containing thick conductor traces be provided.

48 Claims, 5 Drawing Sheets

PROCESS FOR MANUFACTURE OF PRINTED CIRCUIT BOARDS WITH THICK COPPER POWER CIRCUITRY AND THIN COPPER SIGNAL CIRCUITRY ON THE SAME LAYER

FIELD OF THE INVENTION

This invention relates generally to methods of producing printed circuit boards. More particularly the present invention is a method of producing printed circuit boards having thick copper power circuitry and thin copper signal circuitry on the same board.

BACKGROUND OF THE INVENTION

In the past, high power applications, such as, motor controllers, inverters, converters, power supplies, or other control devices, required a number of circuit boards. Typically, this meant separate boards for power modules which house high-power electrical devices, such as, resistors and semiconductors; and circuit boards for logic or customer interface circuit boards (e.g., motherboard) that house microprocessors or other logic devices for performing control functions. See for example U.S. Pat. No. 5,930,112 to Babinski, et al. that discloses electronic motor controllers in such configuration.

Babinski discloses that the use of multiple circuit boards requires circuit board interconnection systems (e.g., connectors, header assemblies, or other hardware) to interface each circuit board. Such interconnection systems are expensive, bulky, add to the cost of assembly, and can create significant impedance-matching problems in high power applications. For example, motor controllers and high power circuits often require "snubbing" circuits to tune the circuit boards and to reduce the parasitic inductive effects and capacitive effects associated with the circuit board interconnection systems. Hence it is desirable to eliminate the interconnection systems altogether.

Similarly, manufacturers of electronic devices have often required both power circuitry and component circuitry. Component circuitry often requires fine line conductor circuitry. For example, it is common for fine line conductors to be in the order of 0.005 inches wide (127 $\mu$m) and generally with the same width spaces between two conductors. The trend in the industry today is to make the fine line conductors and the spaces between them even narrower as, for example, 0.00025 inches wide (6 um).

Examples of semiconductor chips requiring fine line conductors include flip chips, quad flat package (QFP) chips and ultra ball grid array (uBGA). These semiconductor chip types are desirable because of their high I/O density capability, small profiles, and good electrical performance. However, if the surface of the copper is imperfect, either open or short circuits can be created, resulting in printed circuit boards, which for the most part, are rejected.

Multilayer printed circuit boards (MLB's) have been the subject of much invention in order to provide both high current carrying conductor portions and fine line conductors in a single printed circuit board, although on separate layers. U.S. Pat. No. 5,926,377 to Nakao, et al. discloses MLB's containing separate layers for component signals and power source.

MLB's are typically constructed by interleaving imaged conductive layers such as one containing copper with non-conductive layers such as a partially cured B-stage resin, i.e., a prepreg, into a multilayer sandwich which is then bonded together by applying heat and pressure. The conductive layer, e.g., copper circuitry, does not bond well to the non-conductive B-stage resin prepreg. Often intermediate layers are used to bond the B-stage prepreg to the copper circuitry.

In the formation of multilayer circuit boards, it is often necessary to drill holes through the boards. Defects can occur during such operations due to delamination of layers in the areas immediately surrounding a hole. Additionally, hole cleaning chemicals (typically acidic or reductive) can remove the bonding metal oxide-metal hydroxide layer. This removal leads to partial delamination, known as "pink ring." When the multilayer structures are exposed to elevated temperatures for extended periods of time, decay of the bond strength may also occur.

U.S. Pat. No. 5,073,456, issued to Palladino, relates to multilayer printed circuit board. The multilayer printed circuit boards, having a number of through-holes, are prepared by forming an electrically conductive copper circuitry on the surface of a dielectric material and forming a layer of oxide, hydroxide or combinations thereof of tin on the copper circuitry, applying a silane bonding mixture to the surface of the metal oxide, metal hydroxide or combination thereof layer or to an insulating layer to be bonded to the copper circuitry, wherein the insulating layer comprises a partially cured thermosetting polymer composition. A number of through holes are formed in the bonded article and the walls of the through holes are metalized to form electrically conductive paths.

U.S. Pat. No. 5,928,790 issued to Bokisa, relates to multilayer printed circuit board. It attempts to improve the adhesion of copper circuitry to a dielectric layer by covering the copper circuitry with a layer of an oxide, hydroxide, of a metal selected from the group consisting of tin, bismuth, lead, indium, gallium, germanium. Bokisa discloses that this method helps in reducing partial delaminations (pink ring) and improves bonding strength for elevated temperatures.

As an alternate to multilayer boards, inventors have used separately attached insulated conductors (e.g. wiring) for power circuits. U.S. Pat. No. 3,646,572 to Burr discloses such an invention. U.S. Pat. No. 6,042,685 to Shinada, et al. extends this concept to multilayer boards by embedding the wiring into an inner layer of the board.

All of these methods are inferior to a method of combining thick power conductor areas with fine resolution conductor areas on a single layer printed circuit board. Thick conductor areas are suited for power or current carrying conductors. The current carrying capacity of a conductor is determined by the cross sectional area of the conductor. A thicker conductor requires less surface of the final printed circuit board so is especially desirable for dense circuitry. Typically a conductor thickness of 0.0003 to 0.0007 inch (9~18 um) is acceptable for fine resolution signal conductors. However, power conductor areas are preferably 0.004 to 0.016 inch (100–400 um) or thicker. These thick conductor areas have been problematic for manufacture of the printed circuit boards. In its elementary form, a printed circuit board includes, as a component, a dielectric layer of an epoxy resin-impregnated woven glass fiber that is known as "prepreg". On the opposite sides of the prepreg are bonded conductive foil sheets. Subsequently the foil, through a number of photographic processes, is etched to produce conductive paths on the surface of the prepreg layer. When so assembled, the lamination is often called a core or a board.

When preparing a board with thick conductor areas, either the copper foil starts with the required thickness or its thickness must be increased for the thick conductor areas. When starting with a thick profile conductor foil, etching times are long so production is slow and expensive. In addition, the track profile is poor which reduces the ability to create fine resolution conductor areas on the same board. The high conductor profile often interferes with subsequent manufacturing steps. For example high conductor profiles often cause problems with solder mask application, particularly on the corners.

The alternate of using thinner conductor foil, then augmenting the thickness for the thick conductor areas presents similar problems. Such a technique would start with a conductor foil of approximately 0.0028 inch (70 um), imaging and etching the pattern, and then utilize electrodeposition to increase the conductor thickness. This technique requires multiple process steps and produces a product inferior to the invention disclosed herein. For example, the finished conductor thickness formed in this fashion will have inconsistent thickness and poor track profile. Poor track profile reduces the ability to create fine resolution conductor areas. Finally the uneven conductor profile causes problems in subsequent manufacturing steps such as applying a solder mask.

Hence, what would be truly useful is a method of producing a high quality single layer printed circuit board containing both thin conductor areas for fine resolution conductors and thick conductor areas for power circuits without the above-mentioned production issues.

SUMMARY OF THE INVENTION

The present invention is a process of manufacturing printed circuit boards that is useful in the formation of printed circuit boards containing both areas of thick conductive traces and areas of fine resolution conductors in a single conductive layer. A conductive core is first fabricated containing areas of thick conductors on a relatively thin conductive base. In one embodiment, thick conductors comprising copper are electrolytically deposited upon a thin conductive base comprising copper foil. The conductive core is then bonded to an electrically insulating sublayer with the thick conductive areas adjacent to the sublayer in order to form a relatively flat laminate. In one embodiment of the invention, the insulating sublayer comprises high resin "prepreg." Under instances of very thick conductive traces or use of lower resin prepreg, an inner layer of pure resin is inserted between the conductive core and the insulating sublayer. After bonding, the conductive surface of the laminate is formed into printed conductor traces by methods known in the art. For example, chemical etching may be used to remove conductive material not comprising the printed circuits. In various embodiments of the invention a solder mask coating is applied to the completed printed circuit board. By use of this process, a single layer printed circuit comprising both thick conductor traces and fine resolution traces is possible. This invention is also useful in manufacturing a printed circuit core or layer suitable for use as a component in a multilayer printed circuit board where it is desirable that a relative flat layer containing thick conductor traces be provided.

DETAILED DESCRIPTION OF THE INVENTION

Figure 4:
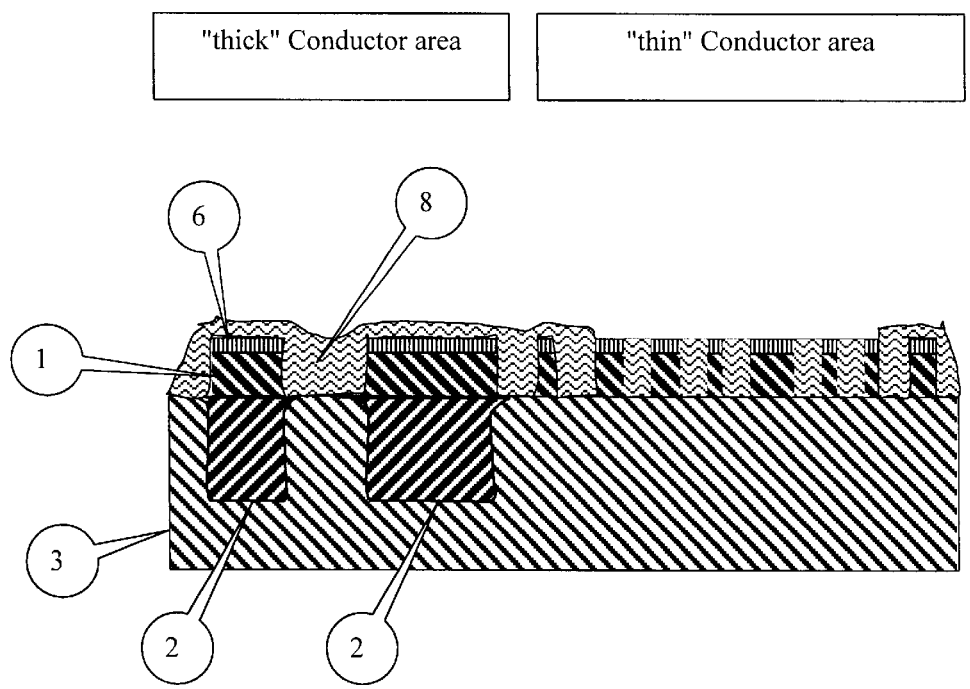
FIG. 4 shows a representative cross-sectional view of a printed circuit board fabricated in accordance with the present invention with depiction of an applied solder mask.

The present invention is a method of forming printed circuit boards (PCB) with a region of thick conductor traces and a relatively flat external surface. FIG. 4 shows a representative cross-sectional view of a printed circuit board fabricated in accordance with this, invention with depiction of an applied solder mask. Printed circuits comprise conductor tracks 1 formed from a conductor core. The "thick" conductor area illustrates where thick conductor traces 2 are bonded to the thinner conductor core. The "thin" conductor area is formed without the added thick conductor bonding. In order to present a flat profile, the thick conductor traces 2 are imbedded in the non-conductive base 3 of the PCB. During the process of completing the PCB, additional conductive material 6 is plated onto the surface of conductor traces. Finally, a solder mask composition 8 may be added to cover and insulate some portions of the conductors while leaving other conductor areas exposed.

Figure 1:
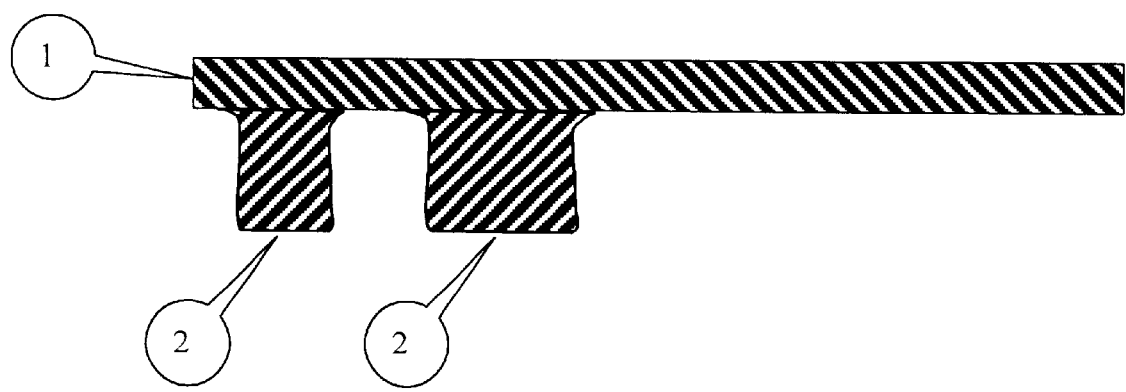
FIG. 1 schematically illustrates the formation of a conducting core to which thick conductor areas have been fabricated in accordance with one embodiment of the present invention.
Figure 3A:
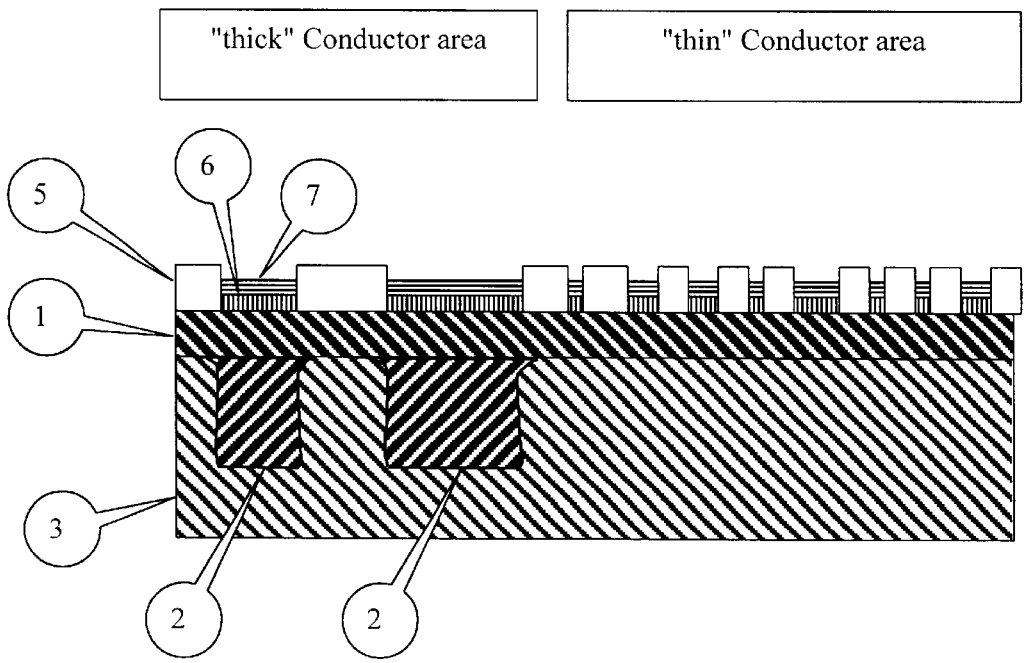
FIG. 3a shows a representative cross-sectional view of a printed circuit board during fabrication in accordance with the present invention with depiction of photo imageable plating resist, copper plated pattern and tin resist.
Figure 3B:
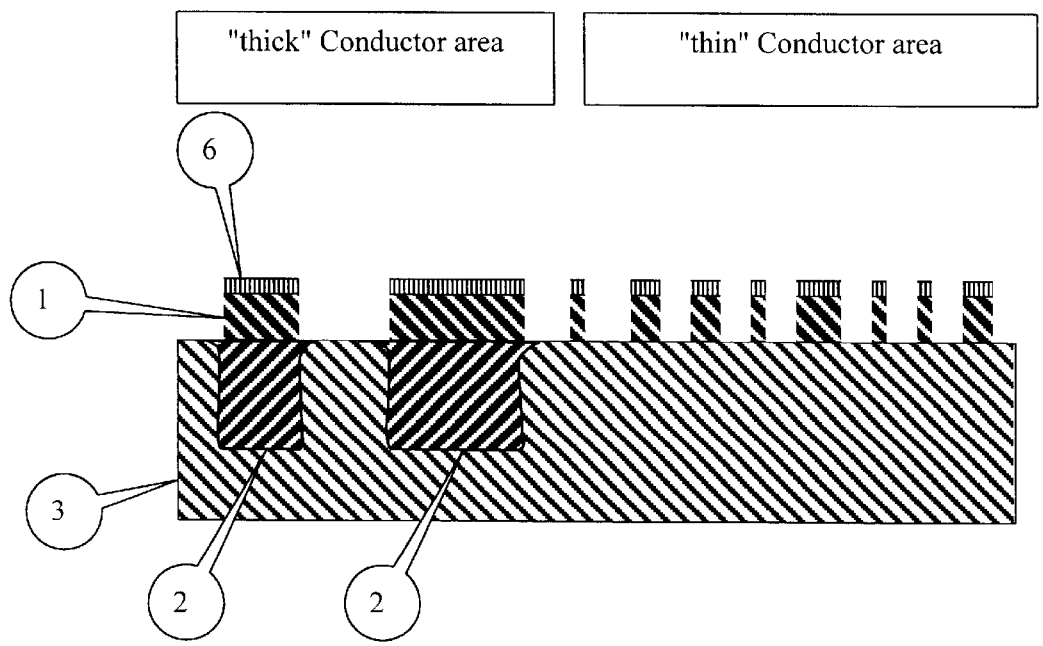
FIG. 3b shows a representative cross-sectional view of a printed circuit board during fabrication in accordance with the present invention with depiction of the photo imageable plating resist removed.

Referring first to FIG. 1, thick conductor traces 2 are added to a conducting core 1. Although any conductor can be used for the core, it is common to use copper foil for this purpose, typically with a thickness of 0.3 to 0.7 mil (9 to 18 um). Thickness of the conducting core is determined by requirements of the subsequently etched fine resolution conductor traces (as depicted in FIG. 3a and FIG. 3b.) As described herein, thicker conducting cores are generally not suitable for high quality fine resolution conductor trace fabrication.

The thick conductor traces 2 are added to the conducting core by any common means known in the art, for example electrolytic or electroless additive plating process. The method of thick conductor addition is not important to the invention. Typically, electrolytic addition will be used to create thick conductor traces by the addition of depositions from 4 to 10 mil thick (100 to 400 um). The thickness of these deposits is determined from an analysis of their intended uses, thicker traces having higher current and power capacity per area of printed circuit board.

Other embodiments of this invention use alternate methods of fabricating the conductor core with thick conductor areas. For example, when the conductor core comprises copper traces and copper foil, methods of copper forming known in the art can be used. These include control depth blanking and routing.

Figure 2A:
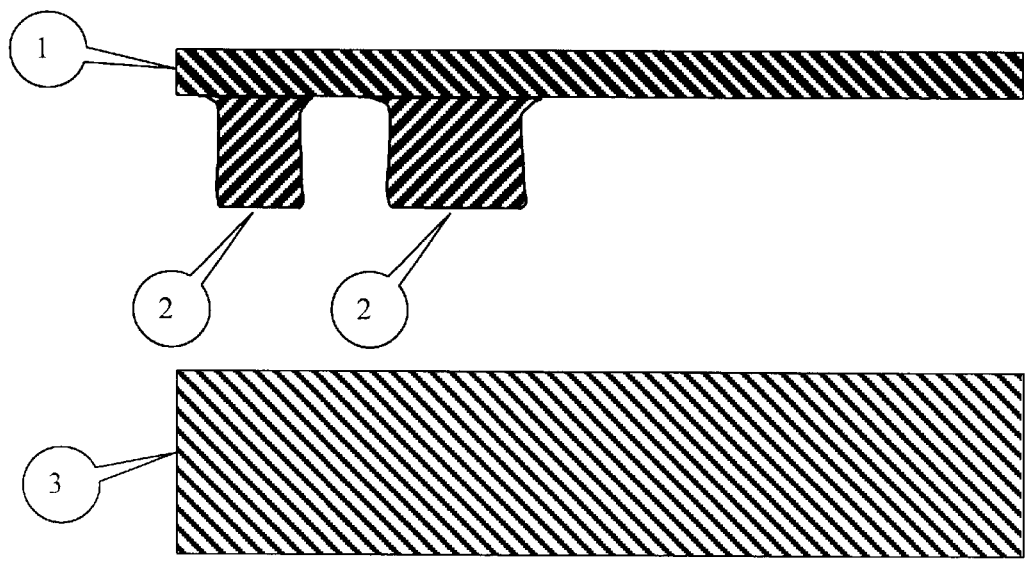
FIG. 2a schematically illustrates positioning of the conducting core above a prepreg substrate in a preferred embodiment of the invention.
Figure 2B:
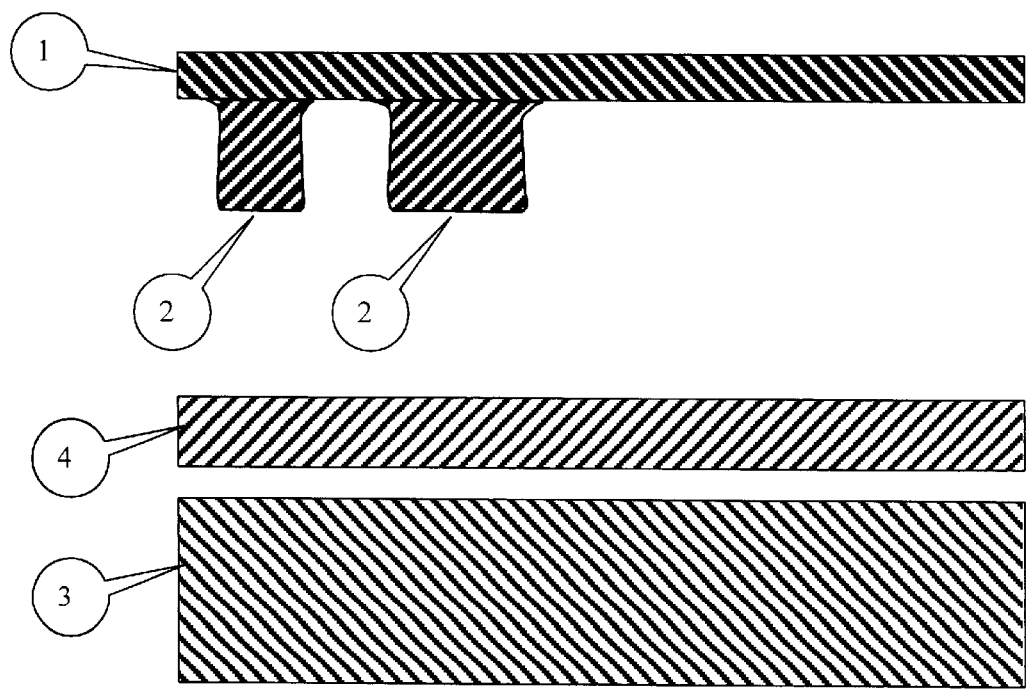
FIG. 2b schematically illustrates positioning of the conducting core above a resin sheet which is positioned above a prepreg substrate in an alternate embodiment of the invention.
Figure 2C:
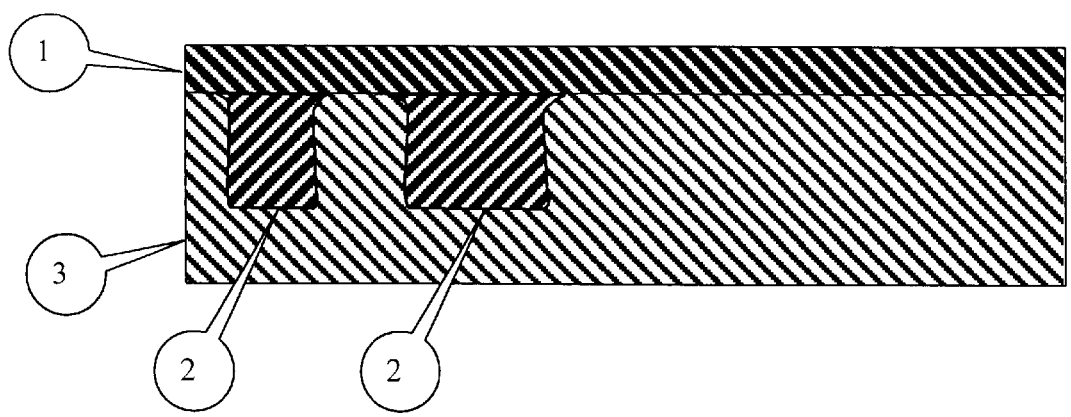
FIG. 2c shows a representative cross-sectional view after the conductive core has been bonded to the prepreg substrate.

FIGS. 2a, 2b and 2c illustrate the bonding of the conductor core 1 containing the thick conductor areas 2 to an insulating sublayer 3. In a typical embodiment the sublayer comprises sheets of glass fiber reinforced with resin that is dried but not cured, commonly referred to as "prepreg". FIG. 2a illustrates positioning the conductor core, completed in FIG. 1, above such an insulating sublayer. The thick conductor traces are adjacent to the surface of the sublayer. After positioning, bonding between the sublayer and conductor core is accomplished, resulting in a completed printed circuit board base shown in FIG. 2c. Bonding can be accomplished by any appropriate method known in the art.

Hot pressing has been found to be particularly useful as the bonding method and tends to produce a relatively flat surface of the printed circuit board base. It is preferable that the bonding step takes place at a sufficient temperature and for a sufficient period of time to enable full and complete curing of the resins in the insulating sublayer.

The sublayer 3 comprising high-resin prepreg is typically found useful for this invention. When high-resin prepreg cannot be used or when bonding to very thick conductor traces is desired, an additional layer of pure resin can be inserted between the conductor core and the sublayer. FIG. 2b illustrates how the pure resin layer 4 is inserted. Bonding then proceeds as before in FIG. 2a. Both in FIGS. 2a and 2b the thick conductor traces are positioned to face toward the sublayer. During the bonding step, the thick trace areas 2 become pressed into the sublayer or resin/sublayer 3 resulting in a relatively flat printed circuit board base.

When used, the pure resin layer 4 must be selected so as to be compatible with the sublayer 3. Preferably a resin similar to the resin present in the sublayer is selected. By using a pure resin intermediate layer, greater flexibility in the selection of sublayer 3 is permitted. For example, the use of a resin layer permits very thick conductor traces to be used with a low resin sublayer.

The thickness of the resin layer 4 is increased to accommodate a sublayer with lower resin content or to accommodate thicker conductor traces. In general, a resin layer is 120% of the thickness of thickest conductor trace when used with a low-resin sublayer although this is not meant as a limitation. This is reduced to 40 to 80% of the thickness of the thickest conductor trace when a high resin sublayer is used.

After completion of bonding of the base conductor 1 to the sublayer, the base board is ready to be circuitized using techniques known in the art. In a typical embodiment, illustrated in FIG. 3a, a photosensitive coating of plating resist 5 is applied to the upper surface of the base board. The coating is dried, photo exposed and developed. Copper plating 6 is deposited to non-resist areas. A tin resist 7 next covers the pattern created by the copper plating. The dry film resist 5 is removed, an etching solution is then applied which removes the underlying exposed conductor pattern. Finally, the tin is stripped off leaving the finished conductor tracks as shown in FIG. 3b.

When desired, a solder mask 8 may be applied to the finished conductor tracks thereby forming the completed printed circuit board shown in FIG. 4. Using the method of the present invention, it is seen that a completed printed circuit board is fabricated that contains both thick conductor track-areas and fine resolution conductor tracks in a single layer printed circuit board. The conductor tracks are available for power and current circuits or other special functions.

For example, thick conductor track areas can be used when higher levels of mechanical bonding to the sublayer is required and for high power semiconductor components. In contrast, the fine resolution tracks are suitable for densely arranged circuitry such as that between very fine pitch components. Such components include flip chips, quad flat package chips and ultra ball grid array chips.

The described invention can also be used as a single layer of a multilayer circuit board. In such a case, the invention herein becomes part of the multilayer "book" and is bonded to the other layers by methods described elsewhere in the art.

While the present invention has been described in the context of the preferred embodiment thereof, it will be readily apparent to those skilled in the art that other modifications and variations can be made therein without departing from the spirit or scope of the present invention. Accordingly, it is not intended that the present invention be limited to the specifics of the foregoing description of the preferred embodiment, but rather as being limited only by the scope of the invention as defined in the claims appended hereto.

We claim:

1. A process of manufacturing a printed circuit board comprising:

forming a conductor core containing a thin base of electrically conductive material and a first predetermined pattern of areas of thick electrically conductive material;

bonding the conductor core to a sublayer of electrically insulating material to create a flat laminate, wherein the areas of thick electrically conductive material are positioned adjacent to the sublayer;

applying a coating of plating resist to an exposed surface of the thin base of electrically conductive material;

patterning the coating of plating resist to expose portions of the thin base of electrically conductive material;

plating electrically conductive material onto the exposed portions of the thin base of electrically conductive material to form on the conductor core a second predetermined pattern of areas of electrically conductive material;

forming a layer of etch resist material atop the second predetermined pattern of areas of electrically conductive material;

removing the patterned coating of plating resist; and forming predetermined printed circuits by removing that portion of the thin base of electrically conductive material not protected by the layer of etch resist material.

2. The process of claim 1 wherein the conductor core and predetermined printed circuits comprise copper.

3. The process of claim 1 wherein forming of the conductive core further comprises:

electrolytically depositing the areas of thick electrically conductive material upon the thin base of electrically conductive material.

4. The process of claim 1 wherein the sublayer of electrically insulating material comprises sheets of glass fiber reinforced with resin that is dried but not cured.

5. The process of claim 4 wherein the bonding of the conductor core to the sublayer of electrically insulating material comprises hot pressing the conductor core to the sublayer.

6. The process of claim 5 wherein the hot pressing cures the resins in the insulating sublayer.

7. The process of claim 1 wherein removing of conductive material is accomplished through chemical etching.

8. The process of claim 1 further comprising applying a solder mask coating over predetermined areas of the printed circuit board.

9. The process of claim 1 wherein said thin base is of a thickness in the range of 0.0003 inches to 0.0020 inches.

10. The process of claim 1 wherein said thin base is of a thickness in the range of 0.0003 inches to 0.0007 inches.

11. The process of claim 1 wherein said areas of thick electrically conductive material comprise conductor traces of a thickness in the range of 0.004 inches to 0.020 inches, formed according to the first predetermined pattern.

12. The process of claim 1 wherein said areas of thick electrically conductive material comprise conductor traces of a thickness in the range of 0.004 inches to 0.010 inches, formed according to the first predetermined pattern.

13. The process of claim 1, wherein at least part of the second predetermined pattern substantially coincides with the first predetermined pattern.

14. The process of claim 13, wherein the predetermined printed circuits comprise both thick printed circuit traces and thin printed circuit traces.

15. The process of claim 13, wherein that part of the second predetermined pattern that substantially coincides with the first predetermined pattern results in thick printed circuit traces, and wherein any part of the second predetermined pattern that does not substantially coincides with the first predetermined pattern results in thin printed circuit traces.

16. The process of claim 1, the process further comprising:
   removing the layer of etch resist material.

17. The process of claim 1, wherein patterning the coating of plating resist comprises:
   drying the coating of plating resist;
   photo exposing the coating of plating resist according to an image of the second predetermined pattern; and
   developing the photo exposed coating of plating resist.

18. A process of manufacturing a printed circuit board comprising:
   forming a conductor core comprising a thin base of conductive material and a first predetermined pattern of areas of thick conductive material;
   bonding the conductor core to an inner layer of resinous material and a sublayer of insulating material to create a flat laminate, wherein the areas of thick conductive material are positioned adjacent to the inner resinous material layer that is in turn positioned adjacent to the sublayer of insulating material, wherein the layer of resinous material is compatible with the sublayer of insulating material;
   plating conductive material onto exposed portions of the thin base of conductive material to form on the conductor core a second predetermined pattern of areas of conductive material;
   forming a layer of etch resist material atop the second predetermined pattern of areas of electrically conductive material; and
   removing that portion of conductive material from the flat laminate that is not protected by the layer of etch resist material to form a predetermined printed circuit.

19. The process of claim 18 wherein the conductor core and predetermined printed circuits comprise copper.

20. The process of claim 18 wherein forming of the conductive core further comprises:
   electrolytically depositing the areas of thick conductive material upon the thin base of conductive material.

21. The process of claim 18 wherein the sublayer of electrically insulating material comprises sheets of glass fiber reinforced with resin that is dried but not cured.

22. The process of claim 21 wherein the bonding of the conductor core to the sublayer of electrically insulating material comprises hot pressing the conductor core to the sublayer.

23. The process of claim 22 wherein the hot pressing cures the resins in the insulating sublayer.

24. The process of claim 18 wherein removing of conductive material is accomplished through chemical etching.

25. The process of claim 18 further comprises applying a solder mask coating over predetermined areas of the printed circuit board.

26. The process of claim 18 wherein said thin base is of a thickness in the range of 0.0003 inches to 0.0020 inches.

27. The process of claim 18 wherein said thin base is of a thickness in the range of 0.0003 inches to 0.0007 inches.

28. The process of claim 18 wherein said areas of thick conductive material comprise conductor traces of a thickness in the range of 0.004 inches to 0.020 inches, formed according to the first predetermined pattern.

29. The process of claim 18 wherein said areas of thick conductive material comprise conductor traces of a thickness in the range of 0.004 inches to 0.010 inches, formed according to the first predetermined pattern.

30. The process of claim 18, wherein at least part of the second predetermined pattern substantially coincides with the first predetermined pattern.

31. The process of claim 30, wherein the predetermined printed circuits comprise both thick printed circuit traces and thin printed circuit traces.

32. The process of claim 30, wherein that part of the second predetermined pattern that substantially coincides with the first predetermined pattern results in thick printed circuit traces, and wherein any part of the second predetermined pattern that does not substantially coincides with the first predetermined pattern results in thin printed circuit traces.

33. The process of claim 18, the process further comprising:
   removing the layer of etch resist material.

34. A process of manufacturing a printed circuit core suitable for use as a component of a multilayer printed circuit board, the process comprising:
   forming a conductor core comprising a thin base of conductive material and a first predetermined pattern of areas of thick conductive material;
   bonding the conductor core to a sublayer of electrically insulating material creating a flat laminate, wherein the areas of thick conductive material are positioned adjacent to the sublayer;
   plating conductive material onto exposed portions of the thin base of conductive material to form on the conductor core a second predetermined pattern of areas of conductive material;
   forming a layer of etch resist material atop the second predetermined pattern of areas of electrically conductive material; and
   removing that portion of conductive material from the flat laminate, that is not protected by the layer of etch resist material, thereby forming predetermined printed circuits.

35. The process of claim 34 wherein the conductor core and predetermined printed circuits comprise copper.

36. The process of claim 34 wherein forming of the conductive core further comprises:

electrolytically depositing the areas of thick conductive material upon the thin base of conductive material.

37. The process of claim 34 wherein the sublayer of electrically insulating material comprises sheets of glass fiber reinforced with resin that is dried but not cured.

38. The process of claim 37 wherein the bonding of the conductor core to the sublayer of electrically insulating material is performed by hot pressing the conductor core to the sublayerl.

39. The process of claim 38 wherein the hot pressing is cures the resins in the insulating sublayer.

40. The process of claim 34 wherein removing of conductive material is accomplished through chemical etching.

41. The process of claim 34 wherein said thin base is of a thickness in the range of 0.0003 inches to 0.0020 inches.

42. The process of claim 34 wherein said thin base is of a thickness in the range of 0.0003 inches to 0.0007 inches.

43. The process of claim 34 wherein said areas of thick conductive material comprise conductor traces of a thickness in the range of 0.004 inches to 0.020 inches, formed according to the first predetermined pattern.

44. The process of claim 34 wherein said areas of thick conductive material comprise conductor traces of a thickness in the range of 0.004 inches to 0.010 inches, formed according to the first predetermined pattern.

45. The process of claim 34, wherein at least part of the second predetermined pattern substantially coincides with the first predetermined pattern.

46. The process of claim 45, wherein the predetermined printed circuits comprise both thick printed circuit traces and thin printed circuit traces.

47. The process of claim 45, wherein that part of the second predetermined pattern that substantially coincides with the first predetermined pattern results in thick printed circuit traces, and wherein any part of the second predetermined pattern that does not substantially coincides with the first predetermined pattern results in thin printed circuit traces.

48. The process of claim 34, the process further comprising:

removing the layer of etch resist material.

* * * * *

UNITED STATES PATENT AND TRADEMARK OFFICE
CERTIFICATE OF CORRECTION

PATENT NO. : 6,651,324 B1
DATED : November 25, 2003
INVENTOR(S) : Guiseppe Pedretti et al.

It is certified that error appears in the above-identified patent and that said Letters Patent is hereby corrected as shown below:

Column 1,
Line 45, after the number "127" in the parenthesis delete the first letter "u" in "uum".

Column 4,
Line 31, after the word "this" delete the comma ",".

Column 9,
Line 11, after the word "sublayer" delete the number "1".

Signed and Sealed this

Second Day of November, 2004

JON W. DUDAS
*Director of the United States Patent and Trademark Office*